United States Patent
Cannon (10) Patent No.: US 7,355,412 B1
(45) Date of Patent: Apr. 8, 2008

(54) REMOTE FAULT MONITORING SYSTEM

(75) Inventor: Michael Cannon, Golden Valley, MN (US)

(73) Assignee: Cannon Technologies, Inc., Golden Valley, MN (US)

( * ) Notice: Subject to any disclaimer, the term of this patent is extended or adjusted under 35 U.S.C. 154(b) by 80 days.

(21) Appl. No.: 11/198,813

(22) Filed: Aug. 5, 2005

Related U.S. Application Data (60) Provisional application No. 60/598,928, filed on Aug. 5, 2004.

(51) Int. Cl.
G01R 31/08 (2006.01)

(52) U.S. Cl. .................. 324/522; 324/512; 324/535

(58) Field of Classification Search .................. 324/522
See application file for complete search history.

(56) References Cited

U.S. PATENT DOCUMENTS

| | | | |
|---|---|---|---|
| 3,983,377 A | 9/1976 | Vitins | |
| 5,202,812 A | 4/1993 | Shinoda et al. | |
| 5,428,549 A | 6/1995 | Chen | |
| 5,452,223 A | 9/1995 | Zuercher et al. | |
| 5,506,789 A | 4/1996 | Russell et al. | |
| 5,734,575 A | 3/1998 | Snow et al. | |
| 5,751,149 A * | 5/1998 | Oberg et al. | 324/533 |
| 6,300,766 B1 | 10/2001 | Schmalz | |
| 6,347,101 B1 | 2/2002 | Wu et al. | |
| 6,359,681 B1 * | 3/2002 | Housand et al. | 356/4.01 |
| 6,404,346 B1 | 6/2002 | Jardic et al. | |
| 6,415,244 B1 | 7/2002 | Dickens et al. | |
| 6,466,030 B2 | 10/2002 | Hu et al. | |
| 6,466,031 B1 | 10/2002 | Hu et al. | |
| 6,477,475 B1 | 11/2002 | Takaoka et al. | |
| 6,525,543 B1 | 2/2003 | Roberts et al. | |
| 6,708,126 B2 * | 3/2004 | Culler et al. | 702/64 |
| 6,714,395 B2 | 3/2004 | Meisinger, Sr. et al. | |
| 6,756,786 B2 | 6/2004 | Choi et al. | |
| 6,822,457 B2 | 11/2004 | Borchert et al. | |
| 6,879,917 B2 | 4/2005 | Turner | |
| 6,900,643 B2 * | 5/2005 | Deng et al. | 324/522 |
| 6,917,888 B2 | 7/2005 | Logvinov et al. | |

(Continued)

OTHER PUBLICATIONS

Cannon Technologies Yukon® Master System Software; www.cannontech.com/products/softwareapplications.asp#yukon ; 3 pages; 2006.

*Primary Examiner*—Andrew H. Hirshfeld
*Assistant Examiner*—Jeff Natalini
(74) *Attorney, Agent, or Firm*—Patterson, Thuente, Skaar & Christensen, P.A.

(57) ABSTRACT

Remote indication devices are each a combination of electrical parameter measurement circuitry, a CPU, and a communication device. Each remote indication device is electrically or electromagnetically coupled to a power distribution circuit conductor to monitor the current flowing in the conductor. The monitored conductor may be an energized power line ("phase"), or a current return line ("neutral"). In either case, the direction of power transfer at each measurement point can also be monitored by each remote indication device. Each remote indication device processes the monitored electrical current information to convert it into a form suitable for data transmission. The information is then presented to a monitoring station. The monitoring station collects and analyzes the electrical current information from the plurality of remote indication devices and is programmed to identify one or more particular power line segments that appear to have a fault.

23 Claims, 5 Drawing Sheets

U.S. PATENT DOCUMENTS

6,924,647 B2 8/2005 Saha et al.
2003/0169052 A1* 9/2003 Yamada et al. ............. 324/543
2005/0021300 A1 1/2005 Kim et al.

* cited by examiner

Fig. 1

Fig. 2A SINGLE PHASE REPRESENTATION OF FAULT MAGNITUDE AND DIRECTIONAL SENSING

REMOTE FAULT MONITORING SYSTEM

CLAIM TO PRIORITY

The present application claims priority to U.S. Provisional Application No. 60/598,928, filed Aug. 5, 2004, and entitled "REMOTE FAULT MONITORING SYSTEM." The identified provisional patent application is hereby incorporated by reference.

TECHNICAL FIELD

The present invention relates generally to power distribution in utility power grids, and more particularly, to detecting and localizing faults on an electric utility power distribution circuit.

BACKGROUND OF THE INVENTION

Power distribution circuits typically used by electric utilities can experience various faults that disrupt service to consumers of electricity. Causes of such faults include electrical insulation breakdown or mechanical failures. Most commonly, faults are manifested as short circuits from line to ground, but line to line short circuits and open circuit faults can also occur. When these events occur, they are readily detectable and safety devices, such as circuit breakers, can be automatically actuated to shut down the distribution circuit. It is important for the utility and its customers to have the problem located and repaired as quickly as possible so that electrical service can be restored with minimal down time. In practice, since power transmission or distribution circuits extend over large distances, repair crews must patrol the entire line section. Locating faults is thus presently time consuming and expensive due to the lost revenue and the cost of lengthy troubleshooting.

Systems known in the art for localizing power line faults include stand-alone (independently-functioning) fault detectors deployed on distribution feeders that emit light or audible alarm signal when they detect an abnormally high current magnitude. This approach does not eliminate the need for repair crews to examine long stretches of power line as part of troubleshooting a line fault.

There are other devices known in the art that can be equipped with contact outputs for use with a SCADA system, but it appears that no integrated system approach exists to date for localizing faults potentially occurring over a long stretch of power line.

Another problem experienced by utilities involves a reverse EMF generated by certain loads in a power outage. Motorized equipment and appliances (air conditioners, for example) that are loads on a broken distribution circuit can, following a fault, generate an EMF in the broken circuit section that appears as a flow of power from the load in a direction opposite the ordinary flow of power during normal system operation. For example, in the case of a line fault affecting one of three phases of a power distribution circuit, a three-phase motor powered by the remaining two phases will continue running, and may well operate as a power generator producing an EMF back onto the wire of the faulty phase. Measuring line current magnitude, alone, near the fault point, is therefore sometimes insufficient to distinguish between an actual fault and a momentary imbalance of the distribution circuit.

Yet another drawback associated with conventional current measuring devices are the hazards associated with installing the devices on the high voltage power lines.

SUMMARY OF THE INVENTION

One aspect of the present invention utilizes conventional communication technologies, along with application software, and remote indication devices, to enable rapid recognition and notification of faulted line segments to facilitate rapid isolation (manual or automatic) and repair thereof.

In one example embodiment, the remote indication devices are each a combination of, but not limited to, electrical parameter measurement circuitry, a CPU, and a communication device. Each remote indication device is electrically or electromagnetically coupled to a power distribution circuit conductor to monitor the current flowing in the conductor. The monitored conductor may be an energized power line ("phase"), or a current return line ("neutral"). In either case, the direction of power transfer at each measurement point can also be monitored by each remote indication device.

According to another example embodiment, each remote indication device processes the monitored electrical current information to convert it into a form suitable for data transmission. The information is then presented to a monitoring station via a suitable mode of communication such as a WAN implemented via land-based telecommunications, two-way radio, microburst cellular, satellite-based telecommunications, or the like. The monitoring station collects and analyzes the electrical current information from the plurality of remote indication devices and, having a database associating each remote indication device with its corresponding location along the power distribution network, is programmed to identify one or more particular power line segments that appear to have a fault.

A monitoring station can determine an existence of a fault condition in various ways, such as by recognizing a change of current magnitude and/or direction from one of the remote indicator devices, or by recognizing a condition where neighboring remote indicator devices report disparate electrical current measurements. The fault information may be presented graphically, or made available via other report format suitable for enabling dispatch of repair personnel to the fault locations(s). In addition, the determined fault location information may be utilized to initiate transmission of control messages to automatic switching equipment located on the distribution system to further isolate faulty segments and allow energizing of non-faulty segments in accordance with a rules-based procedure.

DETAILED DESCRIPTION OF THE PREFERRED EMBODIMENTS

In this detailed description of the various embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the invention. The following detailed description, therefore, is not to be taken in a limiting sense, and the scope of the invention is to be defined by the claims.

Figure 1:
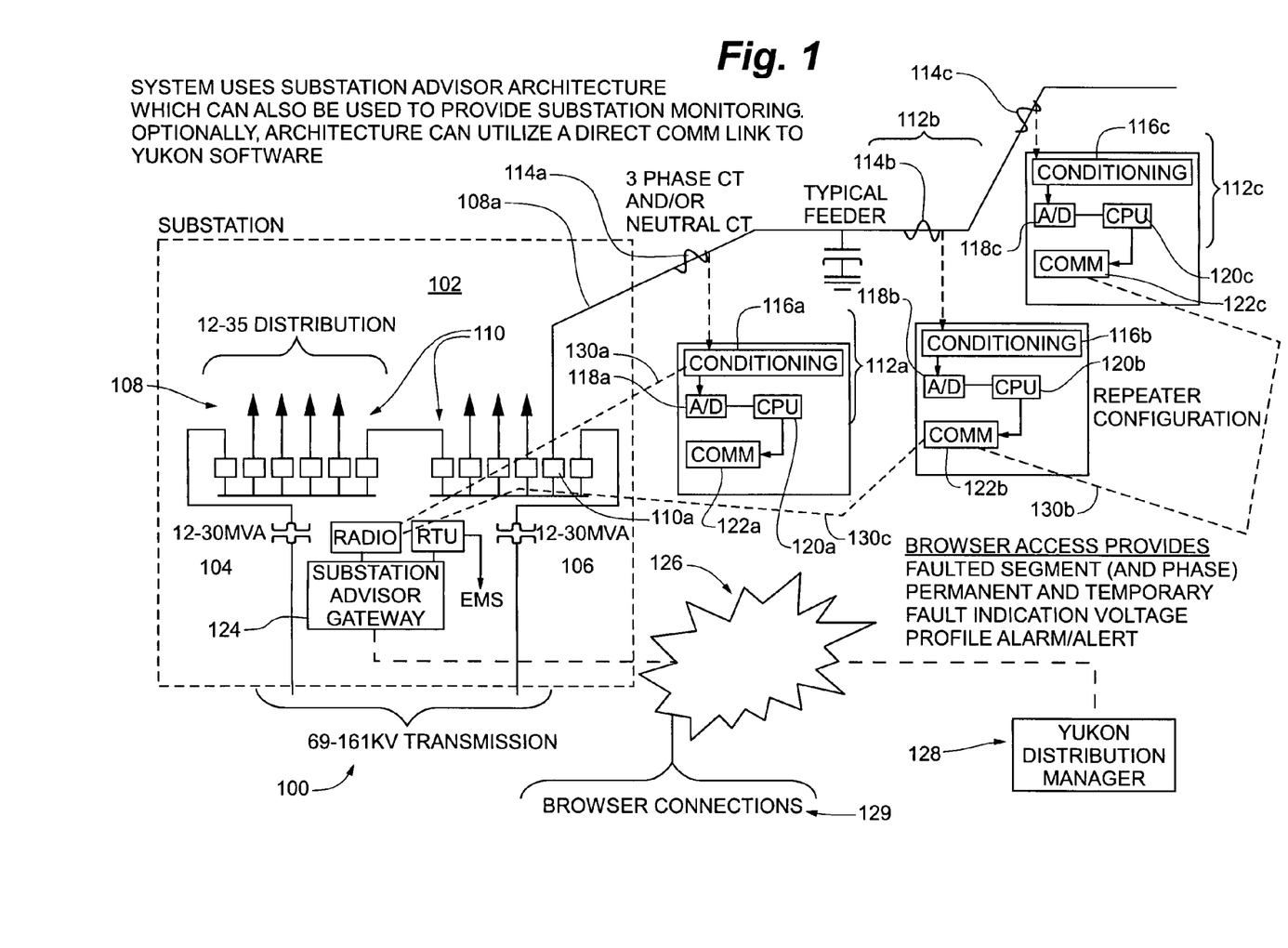
FIG. 1 is a diagram illustrating one example system-level arrangement according to one embodiment of the present invention.

FIG. 1 illustrates an example system configuration according to one embodiment of the present invention. High voltage transmission lines 100 carry generated electricity to distribution substation 102. Substation 102 includes step-down transformers 104 and 106 that reduce the line voltage to an amplitude suitable for distribution. The electricity is distributed into a set of distribution lines (also referred to herein as "feeders") indicated generally at 108, the set includes feeder 108a. Although feeder 108a is shown schematically as a single line in FIG. 1, it should be understood that feeder 108a can represent a three-phase distribution circuit (delta or wye), or a single phase circuit. Each distribution line can be disconnected from the substation 102 by a corresponding circuit breaker indicated generally at 110. Feeder 108a has a corresponding circuit breaker 110a.

Along feeder 108a, remote indication devices 112a, 112b, and 112c (generally referred to hereinafter as 112) are installed. Each remote indicator device 112 includes a current meter. In one embodiment, current metering is accomplished by a current transformer 114a, 114b, 114c (generally referred to hereinafter as current transformer 114) having a secondary winding electromagnetically coupled with the feeder 108 wire, which is the transformer's primary winding. Signal conditioning circuitry 116a, 116b, 116c (generally referred to hereinafter as 116) receives signals from the secondary winding of the associated current transformer 114 and outputs a voltage, current, frequency, or other suitable signal that represents the magnitude of the current conducted through the primary side of the current transformer (the feeder 108 wire). The output of the signal conditioner 116 is fed into an analog-to-digital converter (A/D) 118a, 118b, 118c (generally referred to hereinafter as 118), which periodically samples the signal conditioner's output and generates information readable by a CPU 120a, 120b, 120c (generally referred to hereinafter as 120) such as a microprocessor-based digital system, the information representing sampled electrical current measurements. The CPU 120 buffers the measured electrical current information. Each CPU 120 is interfaced with a corresponding communications subsystem 122a, 122b, 122c (generally referred to hereinafter as communications system 122). Each communications system 122 can communicate over a communications channel implemented using conventional land-based telecommunications, two-way radio, microburst cellular, satellite-based telecommunications, or the like. Each CPU 120 is programmed to pass the buffered measured electrical current information to the corresponding communications system 122 for transmission to a monitoring station. Communications may be achieved by direct communication as illustrated by dotted line 130a, or by relaying data frames via intermediate repeater, as illustrated by dotted lines 130b and 130c.

The monitoring station may be distributed, as illustrated in FIG. 1. In the illustrated example embodiment, a substation advisor gateway 124 receives the information transmitted by each remote indicator device 112, and retransmits the information (optionally in an aggregated format and according to a different communications protocol) via wide area network (WAN) to a control system including a computer running specialized distribution management software 128. A description of an example substation advisor gateway is included in the priority document of the present application, and has been previously incorporated by reference. In another embodiment, a capacitor bank controller may be used in place of a substation advisor gateway. A description of an capacitor bank controller is also included in the priority document of the present application. In one embodiment, access is provided to the information via web browser access 129.

Figures 2A, 2B:
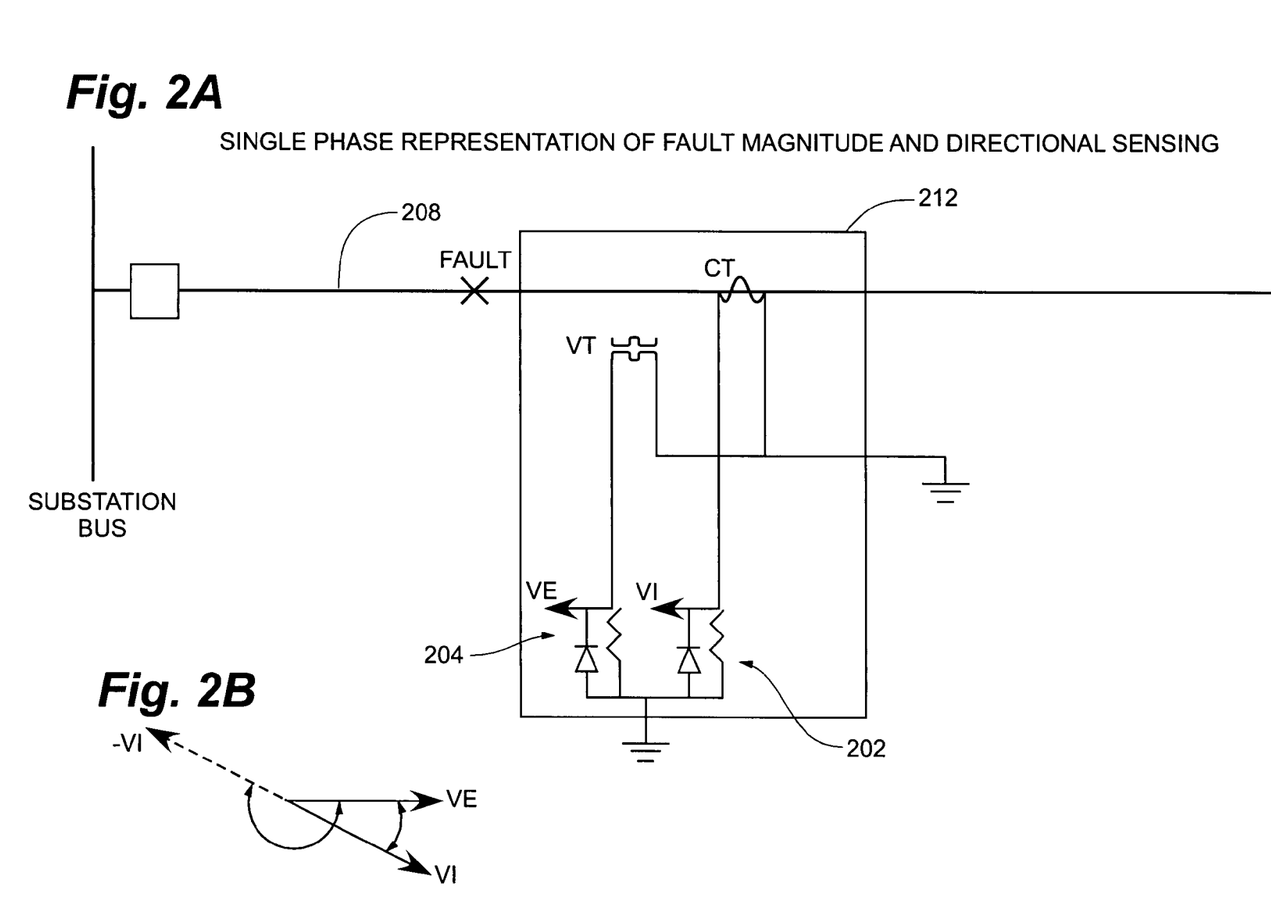
FIG. 2A is a simplified schematic diagram illustrating an arrangement for measuring line current magnitude and phase according to one embodiment of the present invention.
FIG. 2B is a vector diagram illustrating a reference phase angle VE, a second phase angle VI relative to VE, and a theoretical phase reversal of VI.

In some applications, as discussed in greater detail below, it is desirable for the electrical current information to include not only current magnitude, but also the phase angle of the measured current relative to a reference phase. FIG. 2A schematically illustrates an example arrangement for measuring current magnitude, as well as relative phase angle to an AC voltage signal. For simplicity, a distribution circuit 208 is shown as a single line. However, it is to be understood that circuit 208 may be a three phase circuit. A remote indicator device 212 is coupled to circuit 208. Current transformers CT are coupled to each of the phases of the power distribution circuit 208 for measuring the current carried in each line. Voltage tap VT is coupled to one of the phases of circuit 208, and includes a step-down transformer for converting the measured signal to an amplitude suitable for reading by electronic instrument. Each of the current transformers CT and voltage tap VT is connected to a respective analyzer 202, 204 that provides a vector angle corresponding to the phase angle of the measured parameter. Thus, the phase angles of the currents sensed by each of current transformers CT are represented by vectors VI (only one is shown in FIG. 2B), and the reference phase angle of the AC voltage, as sensed by VT, is represented by vector VE. Vectors VI and VE are fed to an analyzer (not shown) that is configured to measure the relative phase angles of each vector VI and vector VE.

In another example embodiment, the reference phase angle of the voltage of one of the lines is not tapped near the point of the current transformer CT, but instead is measured at the distribution station. Certain waveform characteristics of the line currents are transmitted to the monitoring station (not shown), where the relative phase angles are computed. For example, a communications channel such as communication 130a (FIG. 1) can continuously or periodically carry phase synchronization information such as zero crossing points or wave crests of the current waveforms to a receiver and signal analyzer at the monitoring station.

In other embodiments, the reference phase is taken from current waveform monitoring, and vector VE would represent the current phase angle of the measured parameter. Such monitoring can be made of the current flowing in the neutral conductor at the remote indicator site or at another site. Alternatively, current waveform monitoring can be performed at a site different from the phase current monitoring location, such as line current monitoring at the distribution station.

Referring again to the arrangement of FIG. 2A, under normal (non-fault) conditions, the phase angles of the current vectors VI will be about 120 degrees apart from one another. One of the phase angles of the VI vectors will be relatively near the phase angle of vector VE, the difference representing the extent of power factor degradation of the VE phase.

Assuming a particular VI and VE were derived from measurements made from different phases of circuit 208, any dramatic change in their relative phase angles would be indicative of a fault condition occurring on either the VE or the VI phases. If, for example, the amplitude of vector VI drops suddenly, it can be inferred that the associated line has been broken. Referring to FIG. 2B, if the phase angle of VI changes by 180 degrees relative to the VE reference phase angle, it can be inferred that a ground fault has occurred and reverse EMF generated by the load, rather than the utility, is now supplying the current in the line.

Figure 3:
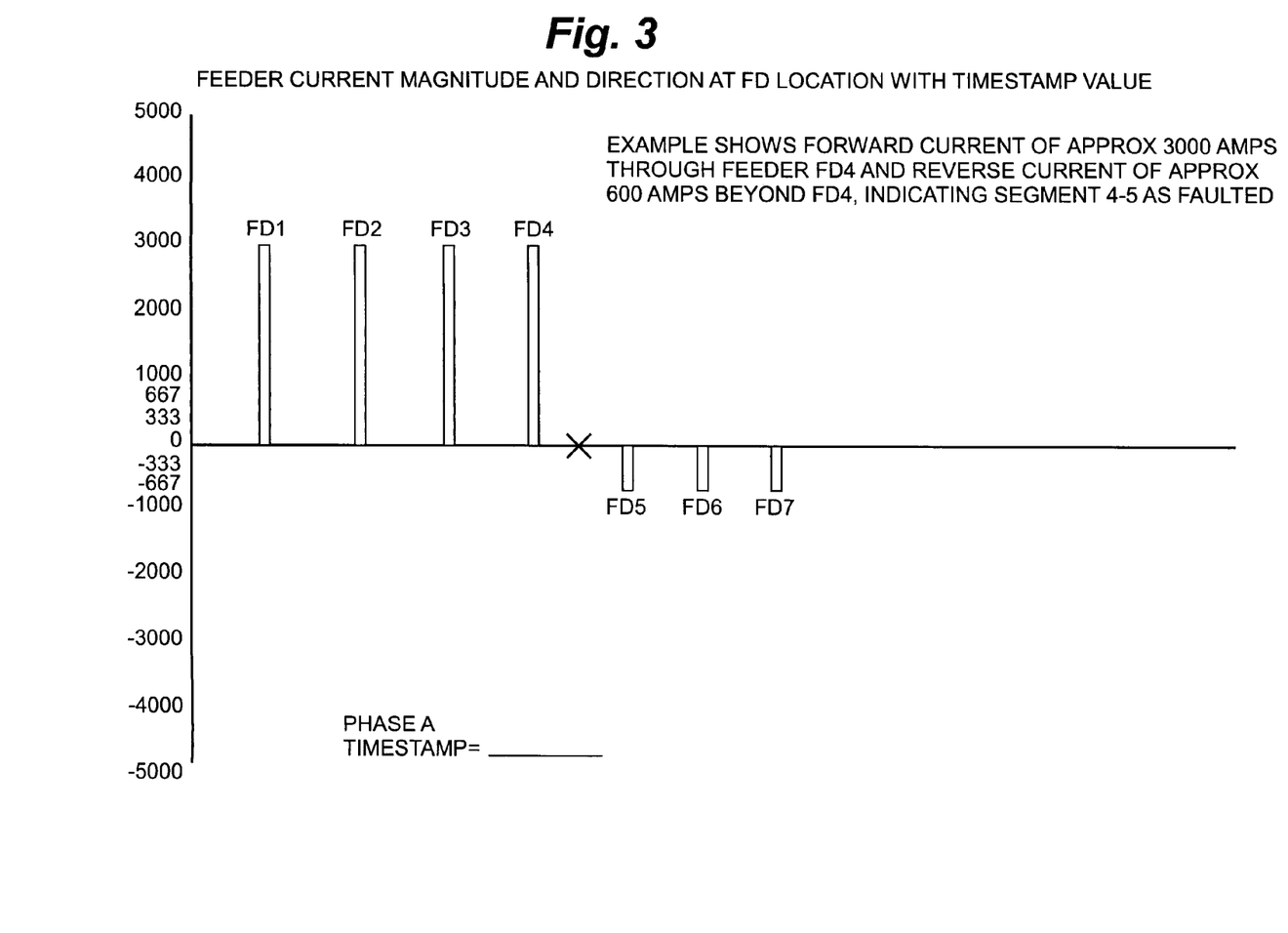
FIG. 3 illustrates a theoretical set of current measurements along an electrical distribution line that can be analyzed according to one embodiment of the present invention to identify and localize a potential fault condition.

Referring now to FIG. 3, a method of analyzing current measurements for identifying and/or localizing a line fault according to one example embodiment is described. FIG. 3 illustrates the measured current magnitude and direction of one particular line. In this example, direction refers to the relative phase angle of the current vector. FD1-FD7 are each a current measurement made at a different point along the line. Measurements FD1-FD4 are all in the same direction and have approximately equal magnitudes. Measurements FD5-FD7 are dramatically different from FD1-FD4. Measurements FD5-FD7 have an opposite direction and a different magnitude. Given this information, a control system can infer that a ground fault has occurred along a segment of line located between the measuring point of FD4 and of FD5. A repair crew can be dispatched directly to the suspect segment of the distribution line.

According to another example embodiment, a method of identifying and/or localizing, faults involves measuring current flowing in the neutral wire of a power transmission or distribution circuit. It is understood that in cases of a line to ground fault (short circuit to ground), the power generated or distributed down the faulty line returns to its source (the generator or distribution point) through a ground path. In single phase or Wye-type three phase distribution circuits, the ground path includes the grounded neutral conductor. Therefore, one method of fault detection/localization is based on the principle that the neutral line will carry at least a detectable portion of the ground fault current.

Figure 4A:
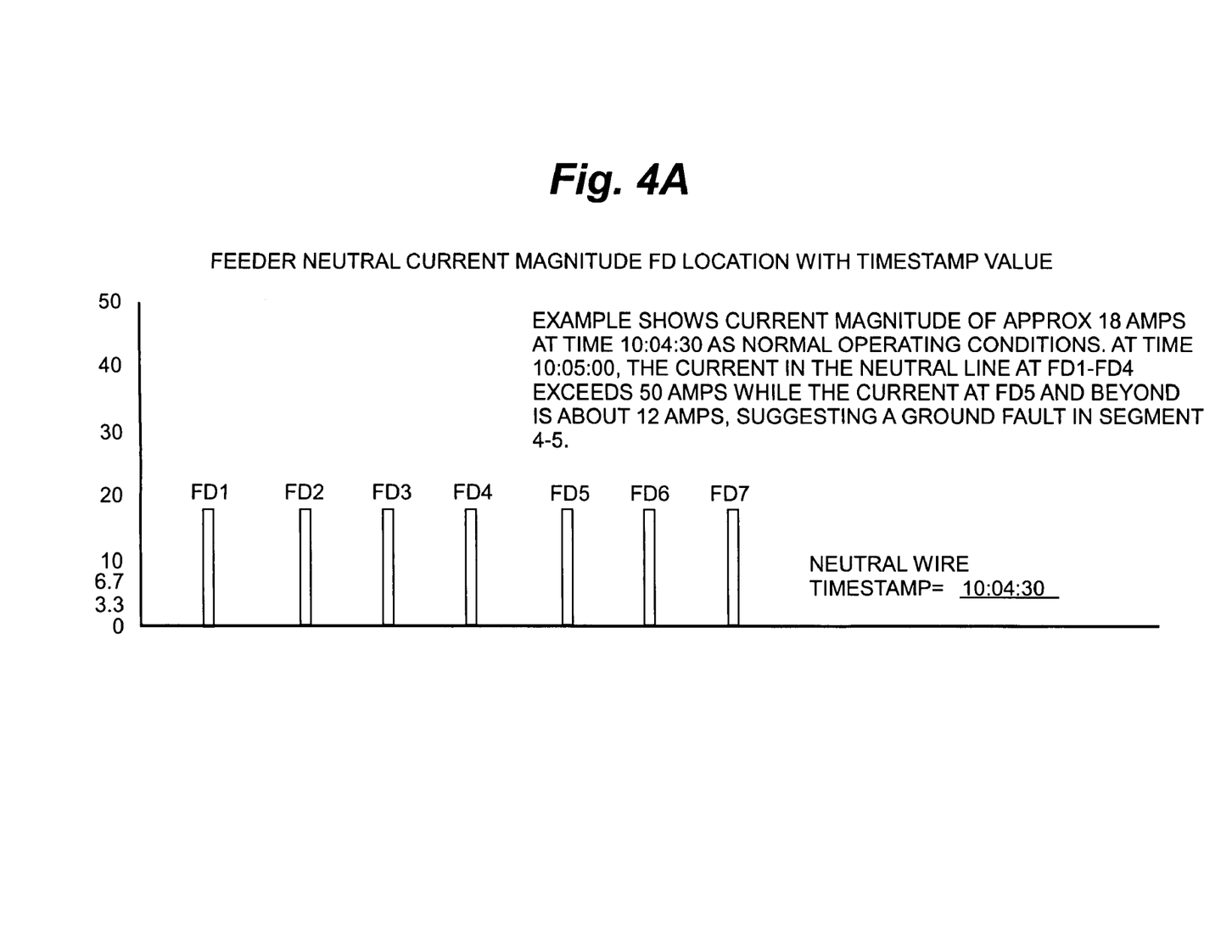
FIGS. 4A and 4B illustrate two theoretical sets of current measurements made at two different moments in time along the same electrical distribution line that can be analyzed according to one embodiment of the present invention to identify and localize a potential fault condition.
Figure 4B:
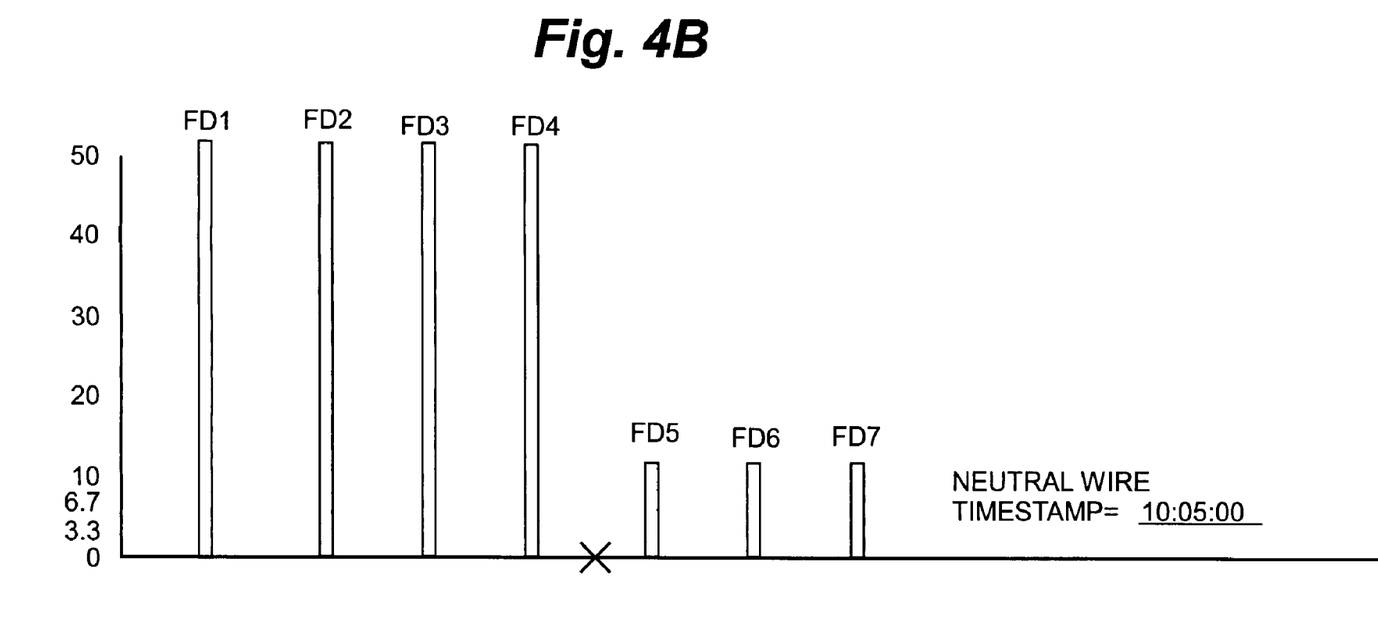

FIGS. 4A and 4B illustrate one example embodiment utilizing measurement of neutral current. Remote indicating devices having current measuring capabilities are placed along a power distribution line at points FD1-FD7, each measuring the current flowing in the neutral wire. At time 10:04:30, no fault condition is present and the neutral wire is carrying approximately 18 Amps. At time 10:05:00, the current measured at points FD1-FD4 is substantially greater, while the current at FD5-FD7 is somewhat less than what was measured previously. Given this information, a control system can infer that a ground fault has occurred along a segment of line located between the measuring point of FD4 and of FD5. A repair crew can be dispatched directly to the suspect segment of the distribution line. The method of applying current measuring devices to the neutral wire, rather than the high voltage wires, provides significant reduction in measurement system equipment and installation cost. Other benefits, such as reduced system complexity and improved reliability, can also be realized.

Although specific embodiments have been illustrated and described herein for purposes of description of an example embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electromechanical, electrical, and computer arts will readily appreciate that the invention may be implemented in a very wide variety of embodiments. This application is intended to cover any adaptations or variations of the various embodiments discussed herein, including the disclosure information in the attached appendices. Therefore, it is manifestly intended that this invention be limited only by the claims and the equivalents thereof.

What is claimed is:

1. A remote fault monitoring system, comprising:
a plurality of remote indication devices, wherein each of said remote indication devices includes:
an electrical parameter measurement circuit, wherein said circuit is electrically or electromagnetically coupled to a high voltage power distribution circuit conductor and samples the power distribution circuit conductor to generate samples that are obtained asynchronous of any injected signals generated by any other remote indication device;
a CPU, wherein said CPU processes the samples to obtains electrical power parameter measurements generated only by the electrical parameter measurement circuit of the remote indication device; and
a communication device, wherein said communication device transmits the measurements obtained by the CPU;
a monitoring station, wherein the monitoring station receives the transmission of the measurements from the CPU of each of the plurality of remote indication devices and determines from the measurements from each of the plurality of remote indication devices whether a fault intermediate a pair of neighboring remote indication devices has occurred.

2. The system of claim 1, wherein said conductor comprises an energized power line or a current return line.

3. The system of claim 2, wherein said monitoring station determines said fault by recognizing a change of current magnitude and/or current direction from of the one of the plurality of remote indication devices, or by recognizing a condition where neighboring remote indicator devices report disparate electrical current measurements.

4. The system of claim 1, wherein the communication device communicates to the monitoring station via WAN implemented land-based telecommunications, two-way radio, microburst cellular, or satellite-based telecommunications.

5. The system of claim 1, wherein said monitoring station includes a database associating each remote indication device with its corresponding location along a power distribution network.

6. The system of claim 1, wherein the determination of a fault by said monitoring station prompts the generation of a report containing fault location information.

7. The system of claim 6, wherein said fault location information prompts the transmission of a control message to an automatic switch located on the distribution system to isolate a faulty segment in the distribution system.

8. A method for remote fault monitoring comprising:
obtaining a plurality of electrical power parameter measurements, each measurement based on samples obtained by one of a plurality of remote indication devices each located at a different points along a conductor in a high voltage power distribution system, said samples being obtained from any one point asynchronous of any injected signal generated at any other point;

transmitting said plurality of electrical power parameter measurements from said plurality of remote indication devices;

receiving the transmitted plurality of electrical power parameter measurements; and analyzing the transmitted plurality of electrical power parameter measurements to determine whether a fault intermediate a pair of neighboring points along said conductor has occurred.

9. The method of claim 8, wherein said conductor comprises an energized power line or a current return line.

10. The method of claim 9, wherein said fault is determined by recognizing a change of current magnitude and/or current direction from a first point to its neighboring point along the conductor, or by recognizing a condition where neighboring points along the conductor report disparate electrical current measurements.

11. The method of claim 8, wherein the electrical measurements are transmitted via WAN implemented land-based telecommunications, two-way radio, microburst cellular, or satellite-based transmissions.

12. The method of claim 8, wherein said step of analyzing includes utilizing a database wherein each electrical measurement is associated with its corresponding point along said conductor.

13. The method of claim 8, further comprising the step of generating a report containing fault location information based upon the analysis.

14. The method of claim 8, further comprising the step of transmitting a control message to automatically isolate a faulty segment along the conductor based upon the analysis.

15. A remote fault monitoring system, comprising:

a plurality of means for obtaining a plurality of electrical power parameter measurements, each means located at a different point along a conductor in a high voltage power distribution system and including:

means for sampling the conductor independent of any other means for obtaining the plurality of electrical power parameter measurements; and means for transmitting said plurality of electrical power parameter measurements;

means for analyzing the transmitted plurality of electrical power parameter measurements to determine whether a fault intermediate a pair of neighboring points along said conductor has occurred.

16. The system of claim 15, wherein said conductor comprises an energized power line or a current return line.

17. The system of claim 16, wherein said fault is determined by recognizing a change of current magnitude and/or current direction from a first point to its neighboring point along the conductor, or by recognizing a condition where neighboring points along the conductor report disparate electrical current measurements.

18. The system of claim 15, further comprising means for formatting the plurality of electrical measurements into a format suitable for transmission.

19. The system of claim 15, wherein means for transmitting comprises WAN implemented land-based telecommunications, two-way radio, microburst cellular, or satellite-based transmissions.

20. The system of claim 15, wherein means for analyzing utilizes a database wherein each electrical measurement is associated with its corresponding point along said conductor in making its fault determination.

21. The system of claim 15, further comprising means for generating a report containing fault location information based upon the analysis.

22. The system of claim 15, further comprising means for transmitting a control message to automatically isolate a faulty segment along the conductor based upon the analysis.

23. A remote fault monitoring system comprising:

a plurality of remote fault detection devices distributed on a high voltage power distribution network, wherein each remote fault detection device includes an electrical parameter measurement circuit, wherein said circuit is electrically or electromagnetically coupled to a power distribution circuit conductor and samples the power distribution circuit conductor to generate samples that are obtained asynchronous of any injected signals generated by any other remote fault detection, a central processing unit (CPU), wherein said CPU processes the samples to obtain measurements generated only by the electrical parameter measurement circuit of the remote fault detection, wherein the measurements generated by the electrical parameter measurement circuit comprise current magnitudes of currents in the power distribution circuit conductor, and a communication device, wherein said communication device transmits the measurement obtained by the CPU;

a monitoring station adapted to receive the measurements transmitted by the communication devices and to determine from the measurements whether a fault intermediate a pair of adjacent remote fault detection devices has occurred.

* * * * *